(12) United States Patent
Apalkov

(10) Patent No.: US 8,374,048 B2
(45) Date of Patent: Feb. 12, 2013

(54) METHOD AND SYSTEM FOR PROVIDING MAGNETIC TUNNELING JUNCTION ELEMENTS HAVING A BIAXIAL ANISOTROPY

(75) Inventor: Dmytro Apalkov, San Jose, CA (US)

(73) Assignee: Grandis, Inc., San Jose, CA (US)

( * ) Notice: Subject to any disclaimer, the term of this patent is extended or adjusted under 35 U.S.C. 154(b) by 293 days.

(21) Appl. No.: 12/854,628

(22) Filed: Aug. 11, 2010

(65) Prior Publication Data

US 2012/0039119 A1    Feb. 16, 2012

(51) Int. Cl.
  *G11C 11/06* (2006.01)
(52) U.S. Cl. ....... 365/225.5; 365/74; 365/157; 365/209; 365/243.5; 365/131
(58) Field of Classification Search .................. 365/74, 365/131, 157, 171, 209, 225.5, 243.5
  See application file for complete search history.

(56) References Cited

U.S. PATENT DOCUMENTS

| 6,532,164 | B2 | 3/2003 | Redon et al. |
| 6,611,405 | B1 | 8/2003 | Inomata et al. |
| 6,967,863 | B2 | 11/2005 | Huai et al. |
| 7,106,624 | B2 | 9/2006 | Huai et al. |
| 7,262,989 | B2 * | 8/2007 | Jeong ............................ 365/158 |
| 2002/0034055 | A1 | 3/2002 | Seyama |
| 2002/0105827 | A1 | 8/2002 | Redon et al. |
| 2003/0007298 | A1 | 1/2003 | Chang et al. |
| 2003/0012050 | A1 | 1/2003 | Iwasaki |
| 2003/0059588 | A1 | 3/2003 | Hannah et al. |
| 2003/0227807 | A1 | 12/2003 | Nakamura et al. |
| 2005/0040433 | A1 | 2/2005 | Nozieres et al. |
| 2005/0104101 | A1 | 5/2005 | Sun et al. |
| 2005/0174702 | A1 | 8/2005 | Gill |
| 2006/0139818 | A1 | 6/2006 | Inaba |
| 2006/0176735 | A1 | 8/2006 | Yuasa |

OTHER PUBLICATIONS

Japanese abstract of publication No. 11-120758, Apr. 30, 1999, Nonvolatile Random Access Memory, Eric Maiken.
Albert, et al., "Polarized Current Switching of a CO Thin Film Nanomagnet", American Institute of Physics, 77(23):3809-11 (2000).
Berger, "Emission of spin waves by a magnetic multilayer traversed by a current", Physical Review B, 54(13)9953-58 (1996).
Katine, et al., "Current-Driven Magnetization Reversal and Spin-Wave Excitations in Co/Cu/Co Pillars", Physical Review Letters, 84(14):3149-52 (2000).
Nishimura, et al., "Magnetic tunnel junction device with perpendicular magnetization films for high-density magnetic random access memory", J. of Applied Physics, 90(8):5246-49 (2002).
Slonczewski, Conductance and exchange coupling of two ferromagnets separated by a tunneling barrier, Physical Review B, 39(10) :6995-7002 (1989).

(Continued)

*Primary Examiner* — Jason Lappas
(74) *Attorney, Agent, or Firm* — Convergent Law Group LLP

(57) ABSTRACT

A method and system for providing a magnetic junction usable in a magnetic device are described. The magnetic junction includes a pinned layer, a nonmagnetic spacer layer, and a free layer. The nonmagnetic spacer layer is between the pinned layer and the free layer. The free layer has a magnetic anisotropy, at least a portion of which is a biaxial anisotropy. The magnetic junction is configured such that the free layer is switchable between a plurality of stable magnetic states when a write current is passed through the magnetic junction.

39 Claims, 7 Drawing Sheets

OTHER PUBLICATIONS

Slonczewski, "Current-driven excitation of magnetic multilayers", J. of Magnetism and Magnetic Materials, 159:L1-L7 (1996).

Slonczewski, "Theory and Application of Exchange-Driven Switching", IEEE, pp. CE-02 (2000).

PCT International Search Report and Written Opinion of the ISA, application No. PCT/US08/64794.

PCT International Search Report and Written Opinion of the ISA, application No. PCT/US08/66369.

PCT International Search Report and Written Opinion of the ISA, application No. PCT/US10/47941.

PCT International Search Report and Written Opinion of the ISA, application No. PCT/US10/59184.

Office Action issued Apr. 2008 for U.S. Appl. No. 11/239,939.

Office Action issued Sep. 2008 for U.S. Appl. No. 11/239,939.

Office Action issued Jan. 2010 for U.S. Appl. No. 12/133,671.

Office Action issued Apr. 2009 for U.S. Appl. No. 12/133,671.

Office Action issued Mar. 2011 for U.S. Appl. No. 12/638,902.

Lew W.S., et al., "Magnetic properties of epitaxial NiFe/Cu/Co spin-valve structures on GaAs(001)," Journal of Applied Physics, American Institute of Physics, vol. 87, No. 9, May 1, 2000, pp. 5947-5849.

International Search Report for PCT/US2011/045662.

* cited by examiner ions and different logical states (e.g. a
METHOD AND SYSTEM FOR PROVIDING MAGNETIC TUNNELING JUNCTION ELEMENTS HAVING A BIAXIAL ANISOTROPY

GOVERNMENT RIGHTS

This invention was made with U.S. Government support under Grant/Contract No. HR0011-09-C-0023 awarded by DARPA. The U.S. Government retains certain rights in this invention.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-RAM. The conventional MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 24.

Conventional contacts 11 and 24 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator such as MgO.

The conventional pinned layer 16 and the conventional free layer 20 are magnetic. The magnetization 17 of the conventional pinned layer 16 is fixed, or pinned, in a particular direction, typically by an exchange-bias interaction with the AFM layer 14. Although depicted as a simple (single) layer, the conventional pinned layer 16 may include multiple layers. For example, the conventional pinned layer 16 may be a synthetic antiferromagnetic (SAF) layer including magnetic layers antiferromagnetically or ferromagnetically coupled through thin conductive layers, such as Ru. In such a SAF, multiple magnetic layers interleaved with a thin layer of Ru may be used. Further, other versions of the conventional MTJ 10 might include an additional pinned layer (not shown) separated from the free layer 20 by an additional nonmagnetic barrier or conductive layer (not shown).

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as in-plane, the magnetization 21 of the conventional free layer 20 may have a perpendicular anisotropy.

To switch the magnetization 21 of the conventional free layer 20, a current is driven perpendicular to plane (in the z-direction). When a sufficient current is driven from the top contact 24 to the bottom contact 11, the magnetization 21 of the conventional free layer 20 may switch to be parallel to the magnetization 17 of the conventional pinned layer 16. When a sufficient current is driven from the bottom contact 11 to the top contact 24, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

When used in STT-RAM applications, the free layer 21 of the conventional MTJ 10 is desired to be switched at a relatively low current. The critical switching current ($J_{c0}$) is the lowest current at which the infinitesimal precession of free layer magnetization 21 around the original orientation becomes unstable. For room-temperature measurements, this value of the current is close to switching current for short pulses (1-20 ns). For example, $J_{c0}$ may be desired to be on the order of a few mA or less. In addition, fast switching times are also desired. For example, it may be desirable for the free layer 20 to be switched in less than twenty nanoseconds. In some cases, switching times of less than ten nanoseconds are desirable. Thus, data are desired to be stored in the conventional MTJ 10 at the higher speeds and using a sufficiently low critical current.

Although the conventional MTJ 10 may be written using spin transfer and used in an STT-RAM, there are drawbacks. For example, the soft error rates may be higher than desired for memories having an acceptable $J_{c0}$ and switching time. The soft error rate is the probability that a cell (i.e. the magnetization 21 of free layer 20 of the conventional magnetic junction) is not switched when subjected to a current that is at least equal to the typical switching current. The soft error rate is desired to be $10^{-9}$ or less. However, the conventional free layer 20 typically has soft error rates greatly in excess of this value. For example, the soft error rate may be several orders of magnitude greater than $10^{-9}$. Consequently, a sufficiently low $J_c$ and a sufficiently fast switching time in combination with an acceptable soft error rate may not be achieved.

Various conventional mechanisms have been introduced in order to improve characteristics including the soft error rate. For example, a complex structure and/or an external magnetic field assist may be used. However, the ability of such conventional schemes to reduce the soft error rate while preserving other characteristics is limited. For example, scalability, energy consumption, and/or thermal stability may be adversely affected by such conventional methods. Thus, performance of a memory using the conventional MTJ is still desired to be improved.

Accordingly, what is needed is a method and system that may improve the performance of the spin transfer torque based memories. The method and system described herein address such a need.

BRIEF SUMMARY OF THE INVENTION

The exemplary embodiments provide methods and systems for providing a magnetic junction usable in a magnetic device. The magnetic junction includes a pinned layer, a nonmagnetic spacer layer, and a free layer. The nonmagnetic spacer layer is between the pinned layer and the free layer. The free layer has a magnetic anisotropy, at least a portion of which is a biaxial anisotropy. The magnetic junction is configured such that the free layer is switchable between a plurality of stable magnetic states when a write current is passed through the magnetic junction.

DETAILED DESCRIPTION OF THE INVENTION

Figure 1:
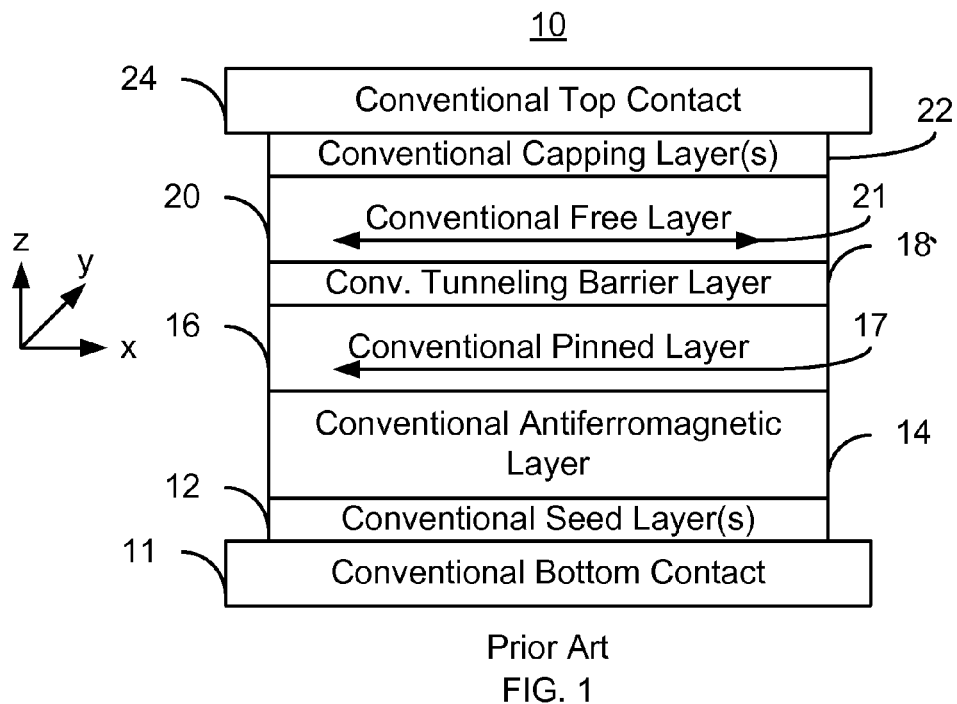
FIG. 1 depicts a conventional magnetic junction.

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems for providing a magnetic junction as well as a magnetic memory utilizing the magnetic junction are described. The exemplary embodiments provide methods and systems for providing a magnetic junction usable in a magnetic device. The magnetic junction includes a pinned layer, a nonmagnetic spacer layer, and a free layer. The nonmagnetic spacer layer is between the pinned layer and the free layer. The free layer has a magnetic anisotropy, at least a portion of which is a biaxial anisotropy. The magnetic junction is configured such that the free layer is switchable between a plurality of stable magnetic states when a write current is passed through the magnetic junction.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2:
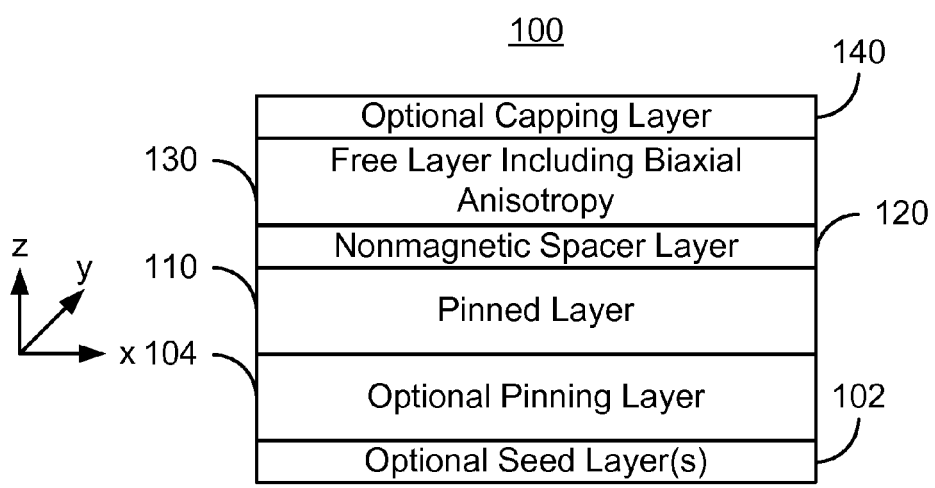
FIG. 2 depicts an exemplary embodiment of a magnetic junction including a free layer having a biaxial anisotropy.

FIG. 2 depicts an exemplary embodiment of a magnetic junction 100 use in a magnetic device, for example a magnetic memory such as an STT-RAM. For clarity, FIG. 2 is not to scale. The magnetic junction 100 includes a pinned layer 110, a nonmagnetic spacer layer 120, and a free layer 130. Also shown are pinning layer 104, which may be used to fix the magnetization (not shown) of the pinned layer 110. In some embodiments, the pinning layer 104 may be an AFM layer or multilayer that pins the magnetization (not shown) of the pinned layer 110 by an exchange-bias interaction. However, in other embodiments, the pinning layer 104 may be omitted or another structure may be used. Further, the magnetic junction 100 may include other and/or additional layers such as optional seed layer(s) 102 and/or optional capping layer(s) 140. The magnetic junction 100 is also configured to allow the free layer 130 to be switched between stable magnetic states when a write current is passed through the magnetic junction 130. Thus, the free layer 130 is switchable utilizing spin transfer torque.

The pinned layer 110 is magnetic and thus may include one or more of Ni, Fe, and Co, particularly in an alloy form. Although depicted as a simple layer, the pinned layer 110 may include multiple layers. For example, the pinned layer 110 may be a SAF including magnetic layers antiferromagnetically or ferromagnetically coupled through thin layers, such as Ru. In such a SAF, multiple magnetic layers interleaved with thin layer(s) of Ru or other material may be used. The pinned layer 110 may also be another multilayer. Although a magnetization is not depicted in FIG. 2, the free layer may have a perpendicular anisotropy energy that exceeds the out-of-plane demagnetization energy.

The spacer layer 120 is nonmagnetic. In some embodiments, the spacer layer 120 is an insulator, for example a tunneling barrier. In such embodiments, the spacer layer 120 may include crystalline MgO, which may enhance the tunneling magnetoresistance (TMR) of the magnetic junction. In other embodiments, the spacer layer may be a conductor, such as Cu. In alternate embodiments, the spacer layer 120 might have another structure, for example a granular layer including conductive channels in an insulating matrix.

The free layer 130 is magnetic and thus may include at least one of Fe, Ni, and/or Co. The free layer 130 has a changeable magnetization (not shown) that may be switched via spin transfer. The free layer 130 is depicted as a single layer. In other embodiments, the free layer 130 may include other layer(s). For example, the free layer may be a SAF that includes one or more of the ferromagnetic layers interleaved with nonmagnetic layer(s). Alternatively, the free layer 130 may include a ferromagnetic or other multilayer.

In addition, the free layer 130 has a magnetic anisotropy. The magnetic anisotropy includes at least a biaxial component. The magnetic anisotropy may also include a uniaxial component. The biaxial component of the magnetic anisotropy may result in an improved soft error rate substantially without adversely affecting characteristics such as the critical switching current $J_{c0}$. Note that the free layer 130 as a whole, a portion (e.g. one or more layers) of the free layer 130, or some other constituents of the free layer 130 may have the biaxial anisotropy.

Figure 3:
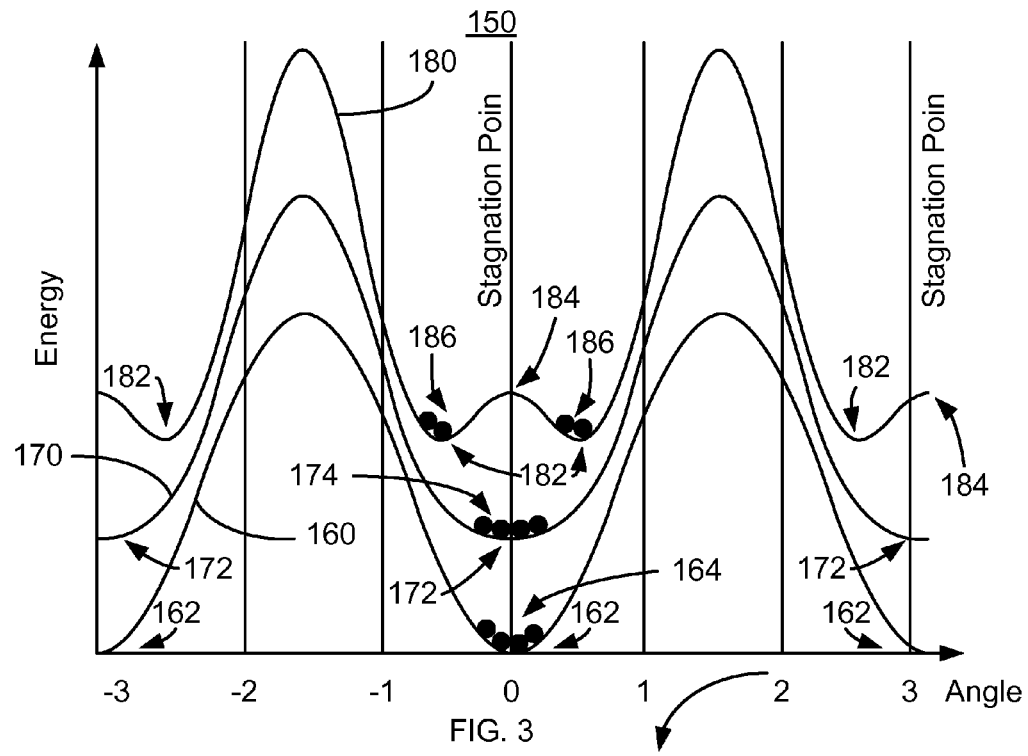
FIG. 3 depicts exemplary embodiments of the anisotropy energy for various magnetic junctions.
Figure 4:
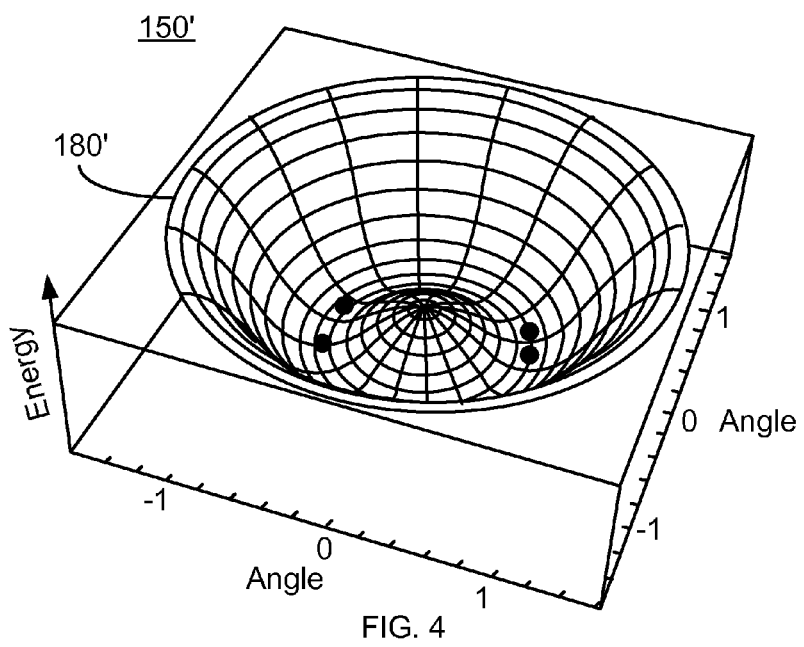
FIG. 4 depicts exemplary embodiments of the anisotropy energy for a magnetic junction.

The effect of the biaxial anisotropy may be understood in the contexts of the graphs 150 and 150' depicted in FIGS. 3 and 4, respectively. The graphs 150 and 150' are for explanatory purposes only and are not meant to reflect a particular magnetic junction. Further, the curves 160, 170, and 180 have been offset for clarity. Referring to FIGS. 2-4, for example, the magnetic anisotropy energy of the free layer 130 may be given as a function of angle from a particular direction by:

$$E(\theta)=K_{uni}\sin^2(\theta)+K_{bi}\sin^2(2\theta)$$

The $K_{uni}\sin^2(\theta)$ term ("uniaxial term") corresponds to a uniaxial magnetic anisotropy. The $K_{bi}\sin^2(2\theta)$ term ("biaxial term") corresponds to a biaxial anisotropy. If the biaxial term is zero, the free layer 130 would have a uniaxial anisotropy. This corresponds to the uniaxial energy curve 160 of FIG. 3. The energy curve 160 has minima 162 along the easy axis direction. Thus, the uniaxial energy curve 160 has minima 162 at $\theta=-\pi, 0, \pi$. Generally, these directions are parallel and antiparallel to the magnetization (not shown) of the pinned layer 110. The initial states of the free layer 130 near zero degrees are shown by points 164. It so happens that these directions (e.g. $\theta=0$) correspond to stagnation points for spin transfer torque and for field torque. At a spin transfer torque stagnation point, the spin polarized current exerts little or no torque on the magnetization of the free layer 130. For a uniaxial anisotropy, the spin transfer torque stagnation point corresponds to the configuration in which the magnetization of the free layer 130 is in equilibrium position and aligned with the easy axis ($\theta=0$ and $\pi$). As used herein, the easy axis corresponds to the directions in which the free layer 130 magnetization is stable for a uniaxial anisotropy alone. Because the uniaxial term corresponds to the free layer 130 magnetization being at the stagnation point, there is a higher probability of the free layer 130 not switching in response to an applied critical current. Thus, the soft error rate may be higher for such a junction.

If the uniaxial term is zero, then the anisotropy energy of for the free layer 130 in the example above is the biaxial term. The free layer 130 would have a biaxial anisotropy. As a result, the energy minima (the stable states of the free layer 130) would be both along and perpendicular to the uniaxial easy axis direction ($\theta=0$, $\pi/2$, and $\pi$). Generally, these directions are parallel, perpendicular, and antiparallel to the magnetization (not shown) of the pinned layer 110. It so happens that one of these directions (e.g. $\theta=\pi/2$) is away from the stagnation point for spin transfer torque. However, the remaining two directions, ($\theta=0, \pi$) are close to the stagnation points for spin transfer torque.

If there is some biaxial anisotropy in addition to the uniaxial anisotropy, the uniaxial energy curve 160 is perturbed by the biaxial term ($K_{bi}\sin^2(2\theta)$). Energy curve 170 depicts the energy versus angle for a small biaxial anisotropy. Stated differently, the absolute value (or magnitude) of the biaxial anisotropy is smaller than that of the uniaxial anisotropy. However, the signs of the biaxial and uniaxial anisotropies may be the same or different. Because of the introduction of a small biaxial term, the curve 170 is flattened near the minima 172 at $-\pi, 0$, and $\pi$. The stable states of the free layer 130 near 0 are shown by points 174. Because the energy curve 170 is flattened, there may be a larger spread in the initial states of the free layer 130 without a change in the energy barrier the magnetization has to overcome to switch to an opposite state. Thus the thermal stability may not be affected. The larger spread in the stable states of the free layer 130 may correspond to the magnetization of the free layer 130 being more likely to be at some angle from the easy axis. In other words, the magnetization of the free layer 130 is more likely to be at an angle other than zero degrees in FIG. 3. Thus, the magnetization of the free layer is more likely to be away from the stagnation points for spin transfer torque. As a result, the magnetization of the free layer 130 may be more easily switched by application of the critical switching current.

As the magnitude of the biaxial term ($K_{bi}\sin^2(2\theta)$) in the magnetic anisotropy energy is further increased, the uniaxial energy curve 160 is further perturbed. Energy curve 180 depicts the energy versus angle for a larger biaxial anisotropy. The biaxial anisotropy for the curve 180 is still less than the uniaxial anisotropy. Stated differently, the absolute value of the biaxial anisotropy is still less than the absolute value of the uniaxial anisotropy. In various embodiments, however, the signs of the uniaxial and biaxial anisotropies may be the same or different. Because of the introduction of a larger biaxial term, the curve no longer has minima at $-\pi$, 0, and $\pi$. Instead, the minima 182 are an angle from $-\pi$, 0, and $\pi$. A local maxima 184 is at and near 0, $-\pi$ and $\pi$. This angle between the easy axis and the minima 182 may be greater than zero and less than $\pi/2$. In some embodiments, the angle is at least $\pi/18$ and not more than $\pi/4$ (10°-45°). In some such embodiments, the angle is at least $\pi/9$ and not more than $\pi/6$(20°-30°). Thus, the stable states of the magnetization of the free layer 130 may be at or near the angle (i.e. at the energy minima of the curve 180). The stable states of the free layer 130 near 0 are shown by points 186. Because the energy curve 180 has a local maximum 184 at 0, the points 186 are at or near the minimum 182. FIG. 4 depicts the energy curve 180' in three dimensions. In the embodiment shown, the curve 180/180' is symmetric around the easy axis (angle is 0). In some embodiments, the free layer 130 magnetization may be at least ten and not more than forty-five degrees from the uniaxial easy axis. In some such embodiments, the free layer 130 magnetization may be stable in a direction at least ten and not more than forty-five degrees from the uniaxial easy axis. The magnetic anisotropy of the free layer 130 may be termed a cone anisotropy and is the combination of a uniaxial anisotropy and a biaxial anisotropy. The larger spread in the initial states of the free layer 130 may mean that the magnetization of the free layer 130 is more likely to be at a small angle, or canted, from the easy axis. In other words, the magnetization of the free layer 130 is more likely to be at an angle other than zero degrees in FIG. 3. Thus, the magnetization of the free layer 130 is more likely to be away from the stagnation points for spin transfer torque.

The introduction of the biaxial anisotropy in the free layer 130 may improve the switching characteristics of the free layer 130. Near 0, the minimum of the energy curve may be flattened (energy curve 170) or moved away from 0 (energy curve 180). The free layer 130 magnetization may thus have a stable state canted from alignment with the easy axis. The magnetization of the free layer 130 may thus be considered to be more easily switched by a spin transfer torque or field induced torque. This characteristic corresponds to a lower soft error rate. This may be true even at high (less than ten microsecond transition times) data rates. It has also been determined that in some embodiments, this improvement may be achieved substantially without adversely affecting the magnitude of the critical switching current. Further, the thermal stability and symmetry of the magnetic junction 100 may not be adversely affected. Because an external magnetic field may not be required to switch the magnetic junction 100, the magnetic junction 100 may be better scalable to higher memory densities. Performance and flexibility of the magnetic junction 100 and a memory using the magnetic junction 100 may thus be improved.

Figure 5:
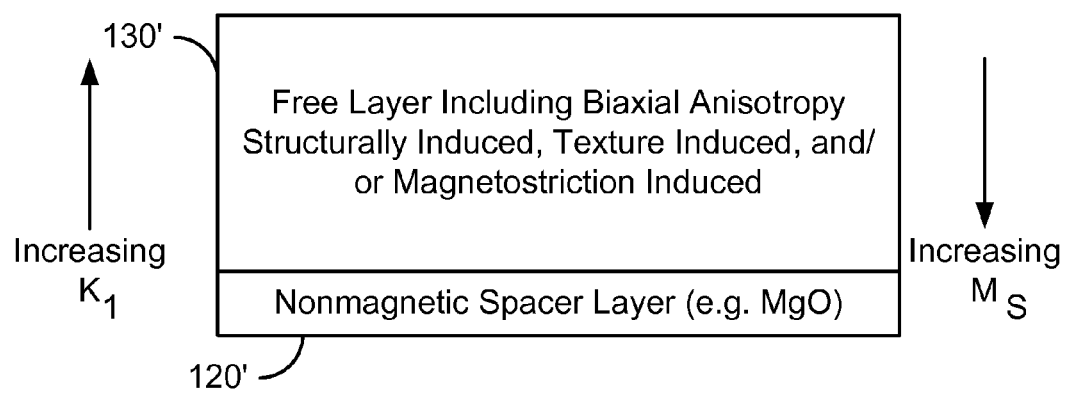
FIG. 5 depicts an exemplary embodiment of a free layer having a biaxial anisotropy.
Figure 6:
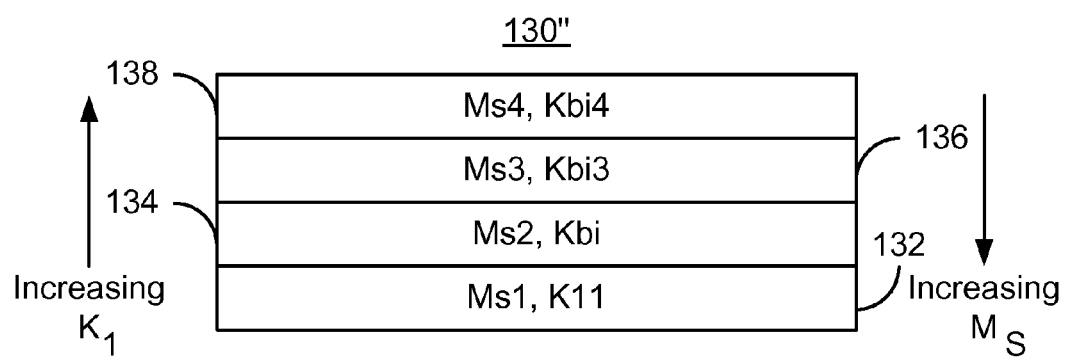
FIG. 6 depicts an exemplary embodiment of a free layer having a biaxial anisotropy.

Introduction of a biaxial anisotropy may improve characteristics of the free layer 130. There are multiple ways to obtain such an anisotropy. FIG. 5 depicts an exemplary embodiment of a free layer 130' having a biaxial anisotropy. Also shown is the nonmagnetic spacer layer 120'. In the embodiment shown, the free layer 130' may have a biaxial anisotropy that is structurally induced, texture induced, and/or magnetostriction induced. In addition to the biaxial anisotropy, the free layer 130 may have a uniaxial anisotropy. For example, if the free layer 130' is to have a structurally induced biaxial anisotropy, the crystalline energy coefficient (K1=$K_{bi}$) increases in one direction, while the saturation magnetization, $M_s$, increases in a second direction opposite to the first direction. One mechanism for achieving this is shown in FIG. 6. FIG. 6 depicts an exemplary embodiment of a free layer 130" having a biaxial anisotropy. The free layer 130" may also have a uniaxial anisotropy. The free layer 130" includes multiple layers. In the embodiment shown, four layers 132, 134, 136, and 138 are shown. Another number of layers may be used in other embodiments. The layers 132, 134, 136, and 138 have saturation magnetizations $M_{s1}$, $M_{s2}$, $M_{s3}$, and $M_{s4}$, respectively. Similarly, the layers 132, 134, 136, and 138 have biaxial crystalline energy coefficients $K_{bi1}$, $K_{bi12}$, $K_{bi13}$, and $K_{bi14}$, respectively. As is seen in FIG. 6, $M_s$ increases closer to the nonmagnetic spacer layer (not shown in FIG. 6). Similarly, $K_{bi}$ decreases closer to the nonmagnetic spacer. Such a multilayer may have a biaxial anisotropy. Alternatively or in addition to the mechanisms above, the biaxial anisotropy may be induced structurally in another manner. In other embodiments, gradations in concentrations of particular materials might be used to achieve an analogous effect. For example, a negative $K_{bi}$ may be used to provide a biaxial anisotropy. Further some materials may be more likely to produce a biaxial anisotropy. For example, the free layer might include one or more of $LaSrMnO_3$, GaAs, MnAs, MnAl, $Nd_2Fe14B$, $Ho_2Fe14B$, NdFeB, Fe, FeCo, $YCo_5$, Ni, ferrites containing little or no Co, $CoOFe_2O_3$, $.FeO-Fe_2O_3$, $MnO-Fe_2O_3$, $NiO-Fe_2O_3$, $MgO-Fe_2O_3$, Thus, the structure of the free layer 130'/130" may be tailored to achieve the desired biaxial anisotropy.

In other embodiments, the biaxial anisotropy might be texture induced. For example, suppose that the magnetic layer(s) having cubic anisotropy is provided. In addition, the free layer 130' may be a thin film having an in-plane anisotropy. The combination may have an energy given by $A \sin^2(\theta)+B \sin^2 2\theta+C \sin^2\theta$, where A, B, and C are coefficients. In such an embodiment, the free layer 130" has a biaxial anisotropy in combination with a uniaxial anisotropy. In addition, the biaxial anisotropy may be induced via magnetostriction in the free layer 130'. Thus, the free layers 130'/130" have a biaxial anisotropy. As a result, the free layers 130/130', when incorporated into a magnetic junction, may provide one or more of the benefits described herein.

Figure 7:
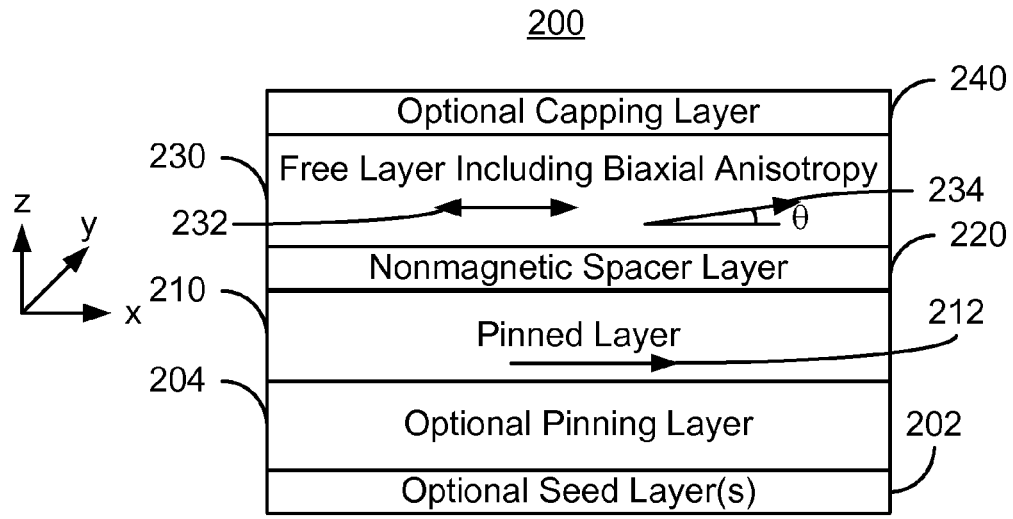
FIG. 7 depicts an exemplary embodiment of a magnetic junction including a free layer having a biaxial anisotropy.

FIG. 7 depicts an exemplary embodiment of a magnetic junction 200 including a free layer having a biaxial anisotropy. For clarity, FIG. 7 is not to scale. The magnetic junction 200 may be used in magnetic memory such as an STT-RAM. The magnetic junction 200 is analogous to the magnetic junction 100, and thus includes similar structures. The magnetic junction 200 includes optional seed layer(s) 202, an optional pinning layer 204, a pinned layer 210, a nonmagnetic spacer layer 220, a free layer 230 and optional capping layer(s) 240 that are analogous to the optional seed layer(s) 102, optional pinning layer 104, the pinned layer 110, the nonmagnetic spacer layer 120, the free layer 130, and optional capping layer(s) 140, respectively. The layers 210, 220, 230, and 240 have a structure and function analogous to those of the layers 110, 120, 130, and 140, respectively. As discussed above, the free layer 230 has a biaxial anisotropy. Consequently, the benefits described above may be achieved.

In addition, the free layer 230 has its easy axis 232, lying substantially in plane. Thus, the perpendicular anisotropy energy does not exceed the out-of-plane demagnetization energy for the free layer 230. Because of the biaxial anisotropy, the stable state of the free layer magnetization 234 is at an angle, $\theta$, from the easy axis 232. The angle $\theta$ corresponds to the energy minima of the energy curve 180. The pinned layer 210 is also shown as having its magnetization 212 fixed in plane. Thus, the perpendicular anisotropy energy does not exceed out-of-plane demagnetization energy for the pinned layer 210. However, in another embodiment, the magnetization 212 may be in another direction.

Figure 8:
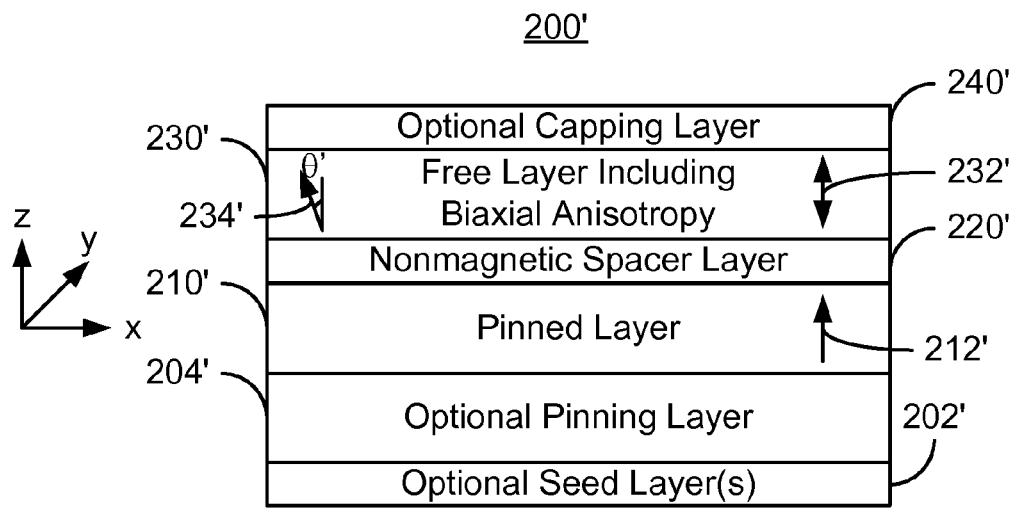
FIG. 8 depicts another exemplary embodiment of a magnetic junction including a free layer having a biaxial anisotropy.

FIG. 8 depicts an exemplary embodiment of a magnetic junction 200' including a free layer having a biaxial anisotropy. For clarity, FIG. 8 is not to scale. The magnetic junction 200' may be used in magnetic memory such as an STT-RAM. The magnetic junction 200' is analogous to the magnetic junctions 100 and 200, and thus includes similar structures. The magnetic junction 200' includes optional seed layer(s) 202', an optional pinning layer 204', a pinned layer 210', a nonmagnetic spacer layer 220', a free layer 230' and optional capping layer(s) 240' that are analogous to the optional seed layer(s) 102/202, optional pinning layer 104/204, the pinned layer 110/210, the nonmagnetic spacer layer 120/220, the free layer 130/230, and optional capping layer(s) 140/240, respectively. The layers 210', 220', 230', and 240' have a structure and function analogous to those of the layers 110, 120, 130, and 140, respectively. In addition, in at least some embodiments, the pinning layer 204' may be omitted. As discussed above, the free layer 230' has a biaxial anisotropy. Consequently, the benefits described above may be achieved.

In addition, the free layer 230' has its easy axis 232', lying substantially perpendicular to plane. Thus, the out-of-plane demagnetization energy of the free layer 230' is less than the perpendicular anisotropy energy. Because of the biaxial anisotropy, the stable state of the free layer magnetization 234' is at an angle, θ', from the easy axis 232. The angle θ' corresponds to the energy minima of the energy curve 180. The pinned layer 210' is also shown as having its magnetization fixed perpendicular to plane. Thus, the out-of-plane demagnetization energy of the pinned layer 210' is less than the perpendicular anisotropy energy, however, in another embodiment, the magnetization 212' may be in another direction.

Figure 9:
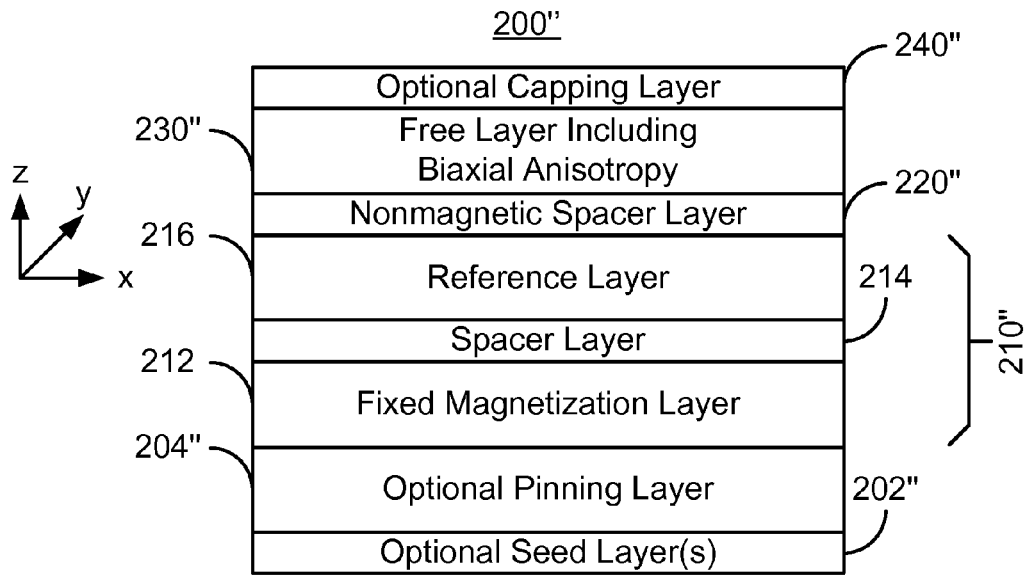
FIG. 9 depicts another exemplary embodiment of a magnetic junction including a free layer having a biaxial anisotropy.

FIG. 9 depicts an exemplary embodiment of a magnetic junction 200" including a free layer having a biaxial anisotropy. For clarity, FIG. 9 is not to scale. The magnetic junction 200" may be used in magnetic memory such as an STT-RAM. The magnetic junction 200" is analogous to the magnetic junctions 100/200/200' and thus includes similar structures. The magnetic junction 200" includes optional seed layer(s) 202", an optional pinning layer 204", a pinned layer 210", a nonmagnetic spacer layer 220", a free layer 230" and optional capping layer(s) 240" that are analogous to the optional seed layer(s) 102/202/202', optional pinning layer 104/204/204', the pinned layer 110/210/210', the nonmagnetic spacer layer 120/220/220', the free layer 130/230/230', and optional capping layer(s) 140/240/240', respectively. The layers 210", 220", 230", and 240" have a structure and function analogous to those of the layers 110/210/210', 120/220/220', 130/230/230', and 140/240/240', respectively. As discussed above, the free layer 230" has a biaxial anisotropy. Consequently, the benefits described above may be achieved. The easy axis of the free layer 230" is not shown and thus may be in the desired direction including perpendicular to plane or in plane.

In addition, the pinned layer 210" is a SAF including ferromagnetic layers 212 and 216 and nonmagnetic spacer 214. In other embodiments, the pinned layer 210" may include additional and/or different layers. The ferromagnetic layer 212 has its magnetization fixed via exchange coupling to the pinning layer 204' or via another mechanism. The reference layer 216 is magnetically coupled to the fixed magnetization layer 212.

Figure 10:
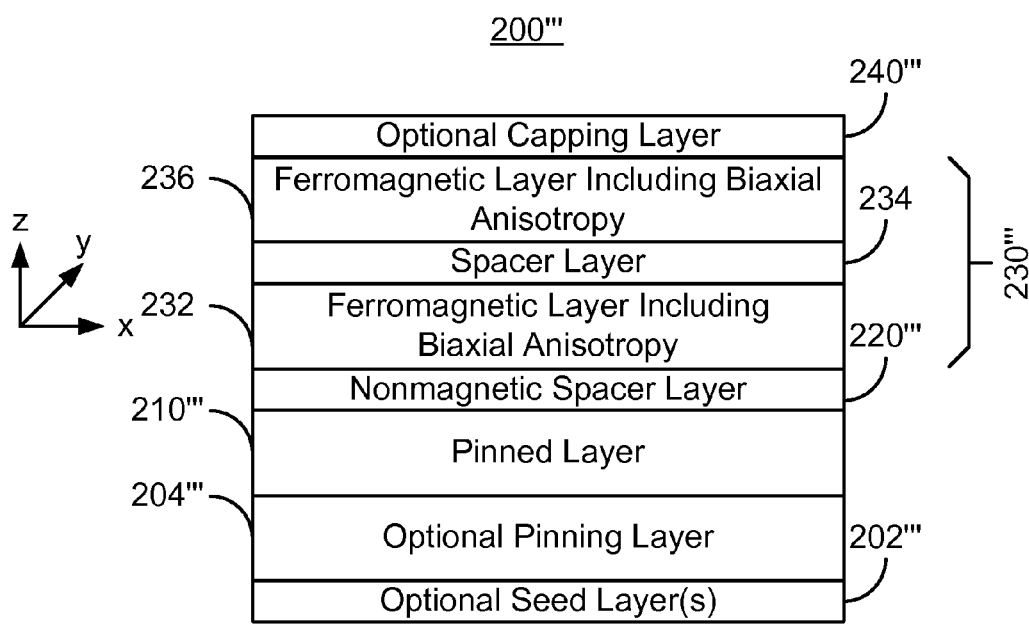
FIG. 10 depicts another exemplary embodiment of a magnetic junction including a free layer having a biaxial anisotropy.

FIG. 10 depicts an exemplary embodiment of a magnetic junction 200'" including a free layer having a biaxial anisotropy. For clarity, FIG. 10 is not to scale. The magnetic junction 200'" may be used in magnetic memory such as an STT-RAM. The magnetic junction 200'" is analogous to the magnetic junctions 100/200/200'/200" and thus includes similar structures. The magnetic junction 200'" includes optional seed layer(s) 202'", an optional pinning layer 204'", a pinned layer 210'", a nonmagnetic spacer layer 220'", a free layer 230'" and optional capping layer(s) 240'" that are analogous to the optional seed layer(s) 102/202/202'/202", optional pinning layer 104/204/204'/204", the pinned layer 110/210/210'/210", the nonmagnetic spacer layer 120/220/220'/220", the free layer 130/230/230'/230", and optional capping layer(s) 140/240/240'/240", respectively. The layers 210'", 220'", 230'", and 240'" have a structure and function analogous to those of the layers 110/210/210'/210", 120/220/220'/220", 130/230/230'/230", and 140/240/240'/240", respectively. As discussed above, the free layer 230'" has a biaxial anisotropy. Consequently, the benefits described above may be achieved. The easy axis of the free layer 230'" is not shown and thus may be in the desired direction including perpendicular to plane or in plane.

In addition, the free layer 230'" is a SAF including ferromagnetic layers 232 and 236 and nonmagnetic spacer 234. The ferromagnetic layers 232 and 236 are magnetically coupled. In some embodiments, the layers 232 and 236 are antiferromagnetically aligned. In others, the layers 232 and 236 are ferromagnetically aligned. The free layer 230'" may also include additional and/or different layers. In various embodiments, one or both of the ferromagnetic layers 232 and 236 include a biaxial anisotropy. Thus, the benefits discussed herein may be achieved.

Figure 11:
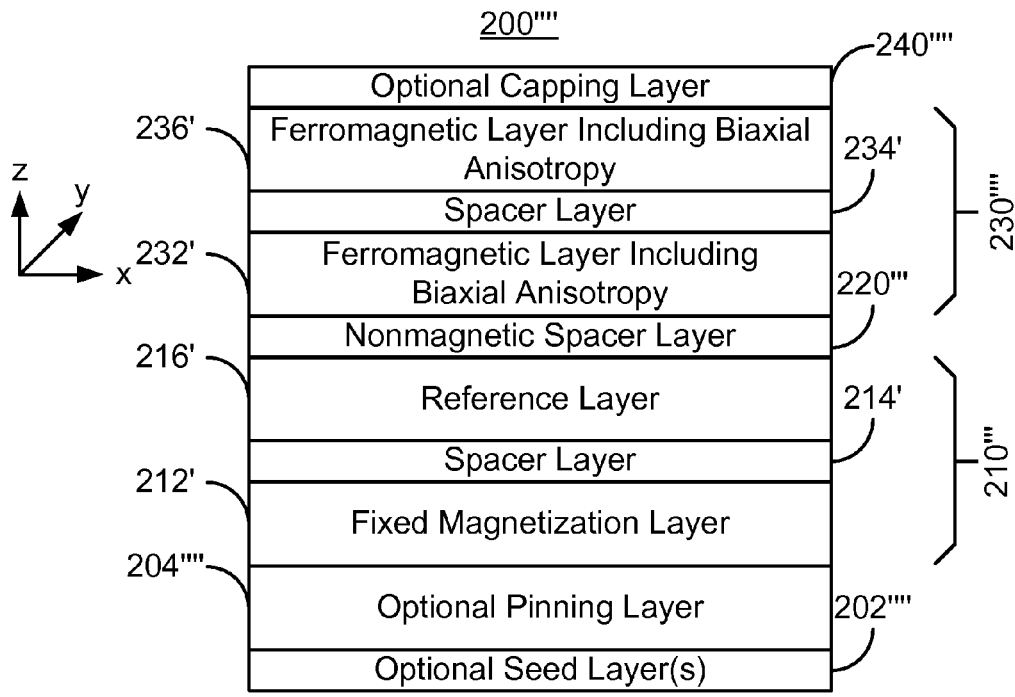
FIG. 11 depicts another exemplary embodiment of a magnetic junction including a free layer having a biaxial anisotropy.

FIG. 11 depicts an exemplary embodiment of a magnetic junction 200"" including a free layer having a biaxial anisotropy. For clarity, FIG. 11 is not to scale. The magnetic junction 200"" may be used in magnetic memory such as an STT-RAM. The magnetic junction 200"" is analogous to the magnetic junctions 100/200/200'/200"/200'" and thus includes similar structures. The magnetic junction 200"" includes optional seed layer(s) 202"", an optional pinning layer 204"", a pinned layer 210"", a nonmagnetic spacer layer 220"", a free layer 230"" and optional capping layer(s) 240"" that are analogous to the optional seed layer(s) 102/202/202'/202"/202'", optional pinning layer 104/204/204'/204"/204'", the pinned layer 110/210/210'/210"/210'", the nonmagnetic spacer layer 120/220/220'/220"/220'", the free layer 130/230/230'/230"/230'", and optional capping layer(s) 140/240/240'/240"/240'", respectively. The layers 210"", 220"", 230"", and 240"" have a structure and function analogous to those of the layers 110/210/210'/210"/210'", 120/220/220'/220"/220'", 130/230/230'/230"/230'", and 140/240/240'/240"/240'", respectively. As discussed above, the free layer 230"" has a biaxial anisotropy. Consequently, the benefits described above may be achieved. The easy axis of the free layer 230"" is not shown and thus may be in the desired direction including perpendicular to plane or in plane.

In the embodiment shown, the free layer 230"" and the pinned layer 210"" are each a SAF. The pinned layer 210"" includes ferromagnetic layers 212' and 216' and nonmagnetic spacer 214'. The ferromagnetic layer 212' has its magnetization fixed via exchange coupling to the pinning layer 204"" or via another mechanism. The reference layer 216' is magnetically coupled to the fixed magnetization layer 214'. The free layer 230"" thus includes ferromagnetic layers 232' and 236' and nonmagnetic spacer 234'. The ferromagnetic layers 232' and 236' are magnetically coupled. In some embodiments, the layers 232' and 236' are antiferromagnetically aligned. In others, the layers 232' and 236' are ferromagnetically aligned. In various embodiments, one or both of the ferromagnetic layers 232' and 236' include a biaxial anisotropy. Thus, the benefits discussed herein may be achieved.

Figure 12:
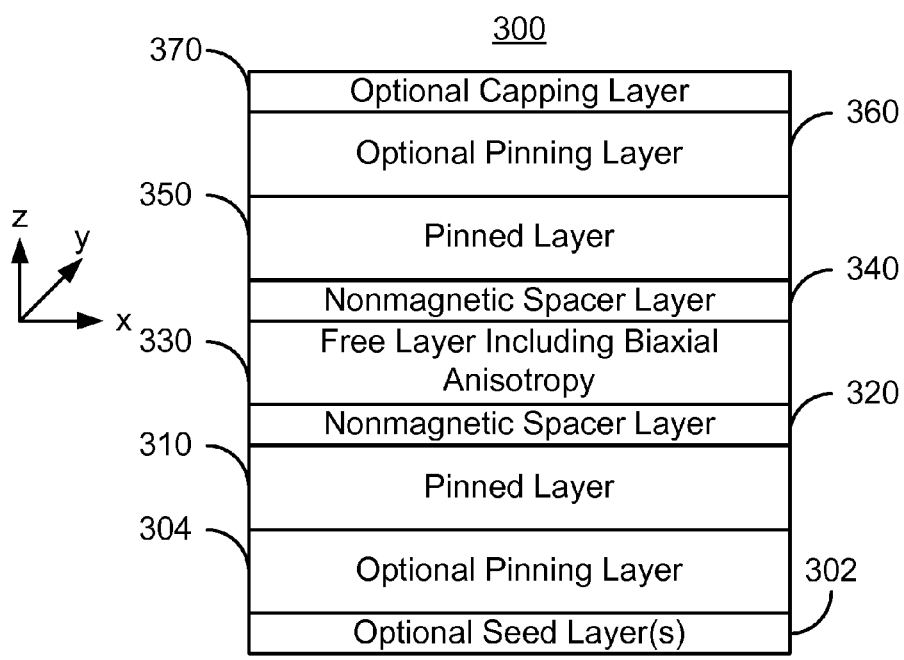
FIG. 12 depicts another exemplary embodiment of a magnetic junction including a free layer having a biaxial anisotropy.

FIG. 12 depicts an exemplary embodiment of a magnetic junction 300 including a free layer having a biaxial anisotropy. For clarity, FIG. 12 is not to scale. The magnetic junction 300 may be used in magnetic memory such as an STT-RAM. The magnetic junction 300 is analogous to the magnetic junctions 100/200/200'/200"/200'"/200"" and thus includes similar structures. The magnetic junction 300 includes optional seed layer(s) 302, an optional pinning layer 304, a pinned layer 310, a nonmagnetic spacer layer 320, a free layer 330, and an optional capping layer(s) 370 that are analogous to the optional seed layer(s) 102/202/202'/202"/202'"/202"", optional pinning layer 104/204/204'/204"/204'"/204"", the pinned layer 110/210/210'/210"/210'"/210"", the nonmagnetic spacer layer 120/220/220'/220"/220'"/220"", the free layer 130/230/230'/230"/230'"/230"", and optional capping layer(s) 140/240/240'/240"/240'"/240"", respectively. The layers 310, 320, 330, and 370 have a structure and function analogous to those of the layers 110/210/210'/210"/210'"/210"", 120/220/220'/220"/220'"/220"", 130/230/230'/230"/230'"/230"", and 140/240/240'/240"/240'"/240"", respectively. The easy axis of the free layer 330 is not shown and thus may be in the desired direction including perpendicular to plane or in plane.

The magnetic junction 300 also includes an additional nonmagnetic spacer layer 340, additional pinned layer 350, and optional additional pinning layer 360. The nonmagnetic spacer layer 340 is analogous to nonmagnetic spacer layer 320. The additional pinned layer 350 and optional additional pinning layer 360 are analogous to the layers 310 and 304, respectively. Thus, the magnetic junction 300 is a dual junction. For example, if the nonmagnetic spacer layers 320 and 340 are insulating tunneling barrier layers, such as crystalline MgO, the magnetic junction 300 is a dual MTJ. If the nonmagnetic spacer layers 320 and 340 are conductive, the magnetic junction 300 is a dual spin valve. Other structures are also possible for the nonmagnetic spacer layers 320 and 340. Further, the nonmagnetic spacer layers 320 and 340 need not be the same.

The free layer 330 has a biaxial anisotropy. Further, the free layer 330 could be analogous to any of the free layers 130, 230, 230', 230", 230'", and/or 230"". Consequently, the benefits described above may be achieved in the dual magnetic tunneling junction. For example, the magnetic junction 300 may have a lower soft error rate without sacrificing thermal stability, scalability, or low critical switching current.

Various magnetic junctions 100, 200, 200', 200", 200'", 200"", and 300 have been disclosed. Note that various features of the magnetic junctions 100, 200, 200', 200", 200'", 200"", and 300 may be combined. Thus, one or more of the benefits of the magnetic junctions 100, 200, 200', 200", 200'", 200"", and 300 such as reduced soft error rate, a perpendicular anisotropy, thermal stability, and/or scalability may be achieved.

Figure 13:
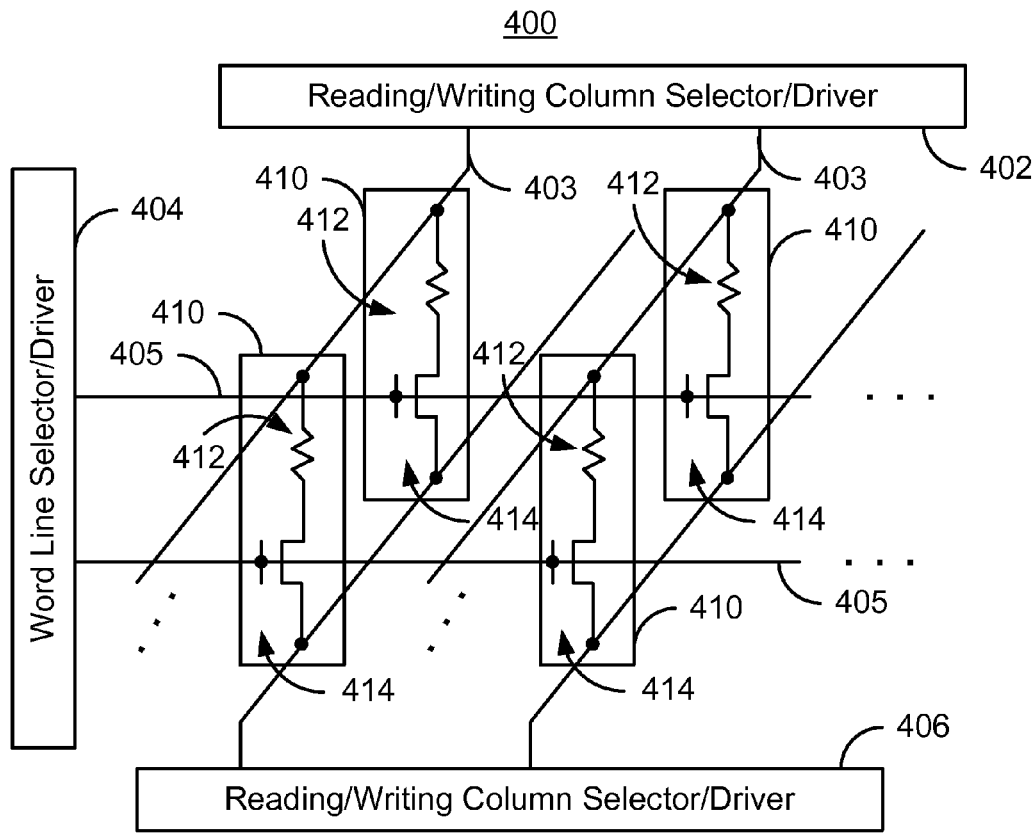
FIG. 13 depicts an exemplary embodiment of a memory utilizing a magnetic substructure in the memory element(s) of the storage cell(s).

Further, the magnetic junctions 100, 200, 200', 200", 200'", 200"", and 300 may be used in a magnetic memory. FIG. 13 depicts an exemplary embodiment of one such memory 400. The magnetic memory 400 includes reading/writing column select drivers 402 and 406 as well as word line select driver 404. Note that other and/or different components may be provided. The storage region of the memory 400 includes magnetic storage cells 410. Each magnetic storage cell includes at least one magnetic junction 412 and at least one selection device 414. In some embodiments, the selection device 414 is a transistor. The magnetic junctions 412 may be one of the magnetic junctions 100, 200, 200', 200", 200'", 200"", and 300. Although one magnetic junction 412 is shown per cell 410, in other embodiments, another number of magnetic junctions 412 may be provided per cell. As such, the magnetic memory 400 may enjoy the benefits described above, such as lower soft error rate and a low critical switching current.

Figure 14:
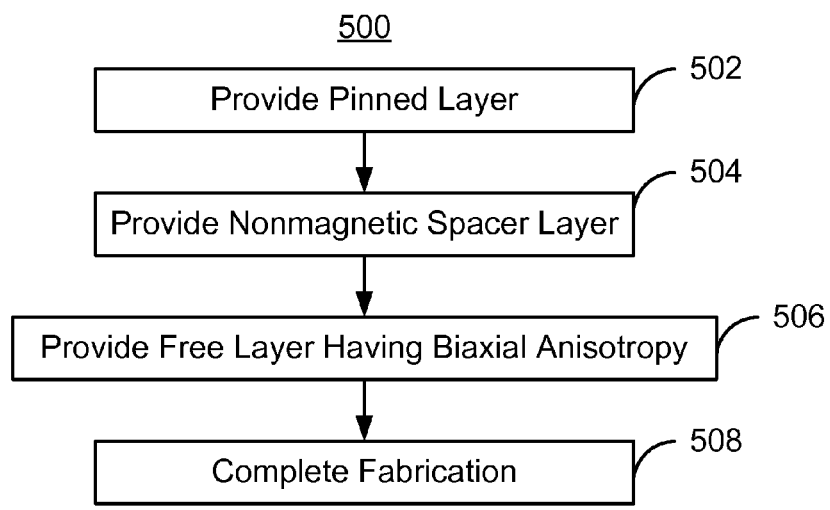
FIG. 14 depicts an exemplary embodiment of a method for fabricating magnetic substructure.

FIG. 14 depicts an exemplary embodiment of a method 500 for fabricating magnetic substructure. For simplicity, some steps may be omitted or combined. The method 500 is described in the context of the magnetic junction 100. However, the method 500 may be used on other magnetic junctions such as the junctions 200, 200', 200", 200'", 200"", and/or 300. Further, the method 500 may be incorporated into fabrication of magnetic memories, such as the magnetic memory 400. Thus the method 500 may be used in manufacturing a STT-RAM or other magnetic memory. The method 500 may commence after the seed layer(s) 102 and optional pinning layer 104 are provided.

The pinned layer 110 is provided, via step 502. Step 502 may include depositing the desired materials at the desired thickness of the pinned layer 110. Further, step 502 may include providing a SAF. The nonmagnetic layer 120 is provided, via step 504. Step 504 may include depositing the desired nonmagnetic materials, including but not limited crystalline MgO. In addition, the desired thickness of material may be deposited in step 502.

The free layer 130 having the biaxial anisotropy is provided, via step 506. In some embodiments, step 506 may be completed by depositing a multilayer, SAF, and/or other structure. Fabrication is then completed, via step 508. For example, the capping layer 140 may be provided. In other embodiments, the additional spacer layer 340, additional pinned layer 350 and optional additional pinning layer 360 may be provided. In some embodiments, in which the layers of the magnetic junction are deposited as a stack, then defined, step 508 may include defining the magnetic junction 100, performing anneals, or otherwise completing fabrication of the magnetic junction 100. Further, if the magnetic junction 100 is incorporated into a memory, such as the STT-RAM 400, step 508 may include providing contacts, bias structures, and other portions of the memory 400.

Thus, the magnetic junction 100, 200, 200', 200", 200'", 200"" and/or 300 is formed. Consequently, the benefits of the magnetic junction may be achieved.

A method and system for providing a magnetic junction and a memory fabricated using the magnetic memory element/magnetic substructure has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

I claim:

1. A magnetic junction for use in a magnetic device comprising:
a pinned layer;
a nonmagnetic spacer layer; and
a free layer having a magnetic anisotropy, the nonmagnetic spacer layer residing between the pinned layer and the free layer, at least a portion of the magnetic anisotropy being a biaxial anisotropy;
wherein the magnetic junction is configured such that the free layer is switchable between a plurality of stable magnetic states when a write current is passed through the magnetic junction.

2. The magnetic junction of claim 1 wherein the magnetic anisotropy includes a uniaxial anisotropy and the biaxial anisotropy.

3. The magnetic junction of claim 2 wherein the uniaxial anisotropy corresponds to an easy axis, wherein the magnetic anisotropy corresponds to a magnetic anisotropy energy having at least one minimum at an angle from the easy axis.

4. The magnetic junction of claim 3 wherein the angle is nonzero.

5. The magnetic junction of claim 4 wherein the angle is at least ten and not more than forty-five degrees.

6. The magnetic junction of claim 5 wherein the angle is at least twenty and not more than forty degrees.

7. The magnetic junction of claim 2 wherein an absolute value of the uniaxial anisotropy is greater than an absolute value of the biaxial anisotropy.

8. The magnetic junction of claim 1 wherein the biaxial anisotropy is crystalline-induced.

9. The magnetic substructure of claim 8 wherein the free layer includes at least one of $LaSrMnO_3$, GaAs, MnAs, MnAl, $Nd_2Fe14B$, $Ho_2Fe14B$, NdFeB, Fe, FeCo, $YCo_5$, $CoOFe_2O_3$, $.FeO\text{---}Fe_2O_3$, $MnO\text{---}Fe_2O_3$, $NiO\text{---}Fe_2O_3$, and $MgO\text{---}Fe_2O_3$.

10. The magnetic junction of claim 1 wherein the biaxial anisotropy is structure-induced.

11. The magnetic junction of claim 10 wherein the free layer has a saturation magnetization and a crystalline anisotropy energy coefficient, the saturation magnetization increasing in a first direction, the crystalline anisotropy energy coefficient increasing in a second direction opposite to the first direction.

12. The magnetic junction of claim 11 wherein the free layer is substantially in a plane and the first direction is substantially perpendicular to the plane.

13. The magnetic junction of claim 12 wherein the free layer includes a plurality of sublayers, each of the plurality of layers having a sublayer saturation magnetization and a sublayer crystalline anisotropy energy coefficient, the sublayer saturation magnetization contributing to the saturation magnetization such that the saturation magnetization increases in the first direction, the sublayer crystalline anisotropy energy coefficient contributing to the crystalline anisotropy energy coefficient such that the crystalline anisotropy energy coefficient increases in the second direction.

14. The magnetic junction of claim 1 wherein the biaxial anisotropy is magnetostriction induced.

15. The magnetic junction of claim 1 wherein the nonmagnetic spacer layer is a tunneling barrier layer.

16. The magnetic junction of claim 1 wherein the nonmagnetic spacer layer is a conductive spacer layer.

17. The magnetic junction of claim 1 wherein the pinned layer includes a reference layer, a spacer layer, and a fixed magnetization layer, the spacer layer residing between the reference layer and the fixed magnetization layer.

18. The magnetic junction of claim 1 wherein the free layer includes a perpendicular anisotropy energy and an out-of-plane demagnetization energy, the out-of-plane demagnetization energy being less than the perpendicular anisotropy energy.

19. The magnetic junction of claim 18 wherein the pinned layer includes a pinned layer perpendicular anisotropy energy and a pinned layer out-of-plane demagnetization energy, the pinned layer out-of-plane demagnetization energy being less than the pinned layer perpendicular anisotropy energy.

20. The magnetic junction of claim 1 wherein the free layer includes a perpendicular anisotropy energy and a out-of-plane demagnetization energy, the out-of-plane demagnetization energy being greater than or equal to the perpendicular anisotropy energy.

21. The magnetic junction of claim 1 further comprising:
an additional pinned layer; and
an additional nonmagnetic spacer layer, the additional nonmagnetic spacer layer residing between the free layer and the additional pinned layer.

22. The magnetic junction of claim 21 wherein at least one of the nonmagnetic spacer layer and the additional nonmagnetic spacer layer includes crystalline MgO.

23. A magnetic memory comprising:
a plurality of magnetic storage cells, each of the plurality of magnetic storage cells including at least one magnetic junction, the at least one magnetic junction including a pinned layer, a nonmagnetic spacer layer, and a free layer having a magnetic anisotropy, the nonmagnetic spacer layer residing between the pinned layer and the free layer, at least a portion of the magnetic anisotropy being a biaxial anisotropy
the at least one magnetic junction being configured to allow the free layer to be switched between a plurality of stable magnetic states when a write current is passed through the magnetic junction.

24. The magnetic memory of claim 23 wherein the magnetic anisotropy includes a uniaxial anisotropy and the biaxial anisotropy.

25. The magnetic memory of claim 24 wherein the uniaxial anisotropy corresponds to an easy axis, wherein the magnetic anisotropy corresponds to a magnetic anisotropy energy having at least one minimum at an angle from the easy axis.

26. The magnetic memory of claim 25 wherein the angle is at least ten and not more than forty-five degrees.

27. The magnetic memory of claim 26 wherein the angle is at least twenty and not more than forty degrees.

28. The magnetic junction of claim 2 wherein an absolute value of the of uniaxial anisotropy is greater than an absolute value of the biaxial anisotropy.

29. The magnetic memory of claim 24 wherein the biaxial anisotropy is at least one of crystalline-induced, structure induced, and magnetostriction induced.

30. The magnetic memory of claim 29 wherein the free layer includes at least one of $LaSrMnO_3$, GaAs, MnAs, MnAl, $Nd_2Fe14B$, $Ho_2Fe14B$, NdFeB, Fe, FeCo, $YCo_5$, $CoOFe_2O_3$, $.FeO\text{---}Fe_2O_3$, $MnO\text{---}Fe_2O_3$, $NiO\text{---}Fe_2O_3$, and $MgO\text{---}Fe_2O_3$.

31. The magnetic memory of claim 29 wherein the free layer has a saturation magnetization and crystalline anisotropy energy coefficient, the saturation magnetization increasing in a first direction, the crystalline anisotropy energy coefficient increasing in a second direction opposite to the first direction.

32. The magnetic memory of claim 31 wherein the free layer is substantially in a plane and the first direction is substantially perpendicular to the plane.

33. The magnetic memory of claim 32 wherein the free layer includes a plurality of sublayers, each of the plurality of layers having a sublayer saturation magnetization and a sublayer crystalline anisotropy energy coefficient, the sublayer saturation magnetization contributing to the saturation magnetization such that the saturation magnetization increases in the first direction, the sublayer crystalline anisotropy energy coefficient contributing to the crystalline anisotropy energy coefficient such that the crystalline anisotropy energy coefficient increases in the second direction.

34. The magnetic memory of claim 23 wherein the nonmagnetic spacer layer is a tunneling barrier layer.

35. The magnetic memory of claim 23 wherein the pinned layer includes a reference layer, a spacer layer, and a fixed magnetization layer, the spacer layer residing between the reference layer and the fixed magnetization layer.

36. The magnetic memory of claim 23 wherein the free layer includes a perpendicular anisotropy energy and an out-of-plane demagnetization energy, the out-of-plane demagnetization energy being less than the perpendicular anisotropy energy.

37. The magnetic memory of claim 23 wherein the free layer includes a perpendicular anisotropy energy and a out-of-plane demagnetization energy, the out-of-plane demagnetization energy being greater than or equal to the perpendicular anisotropy energy.

38. The magnetic memory of claim 23 wherein the magnetic junction further includes:
   an additional pinned layer; and
   an additional nonmagnetic spacer layer, the additional nonmagnetic spacer layer residing between the free layer and the additional pinned layer.

39. The magnetic junction of claim 21 wherein at least one of the nonmagnetic spacer layer and the additional nonmagnetic spacer layer includes crystalline MgO.

* * * * *